(12) United States Patent
Lee et al.

(10) Patent No.: US 11,258,050 B2
(45) Date of Patent: Feb. 22, 2022

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Byungjoo Lee, Seoul (KR); Youngbok Lee, Paju-si (KR); Keongjin Lee, Seoul (KR); Taeyoung Heo, Seoul (KR); Wonsik Lee, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/999,721

(22) Filed: Aug. 21, 2020

(65) Prior Publication Data

US 2020/0381667 A1 Dec. 3, 2020

Related U.S. Application Data

(62) Division of application No. 16/526,856, filed on Jul. 30, 2019, now Pat. No. 10,790,474.

(30) Foreign Application Priority Data

Sep. 6, 2018 (KR) ........................ 10-2018-0106744

(51) Int. Cl.
*H01L 51/52* (2006.01)
*H01L 27/32* (2006.01)

(52) U.S. Cl.
CPC ...... *H01L 51/5275* (2013.01); *H01L 27/3246* (2013.01); *H01L 27/3272* (2013.01); *H01L 51/5256* (2013.01)

(58) Field of Classification Search
CPC ............. H01L 51/5275; H01L 27/3246; H01L 51/5256; H01L 27/3272; H01L 51/56;
(Continued)

(56) References Cited

U.S. PATENT DOCUMENTS 8,569,783 B2 10/2013 Aoyama et al.
8,592,833 B2 11/2013 Lee et al.
(Continued)

FOREIGN PATENT DOCUMENTS

CN 102918667 A 2/2013
JP 2004-317559 A 11/2004
(Continued)

OTHER PUBLICATIONS

Taiwan Intellectual Property Office, Office Action, TW Patent Application No. 108130879, dated May 1, 2020, six pages.
(Continued)

*Primary Examiner* — Shahed Ahmed
(74) *Attorney, Agent, or Firm* — Fenwick & West LLP

(57) ABSTRACT

An organic light-emitting display device capable of improving luminance and light extraction efficiency thereof while preventing image blur, and a method for manufacturing the same is disclosed. In accordance with the device and the method, image blur is suppressed and luminance and light-emitting efficiency are improved by forming micro-lenses on an encapsulating layer for protecting organic light-emitting elements at precise positions corresponding to the elements in a self-aligned and self-assembled manner.

6 Claims, 12 Drawing Sheets

(58) Field of Classification Search
CPC ......... H01L 2251/5315; H01L 51/5281; H01L 51/5237; H01L 27/32; H01L 27/3244–3279; H01L 27/3283; H01L 27/3295; H01L 27/326–3265; H01L 51/5262–5284
See application file for complete search history.

(56) References Cited

U.S. PATENT DOCUMENTS

| | | |
|---|---|---|
| 10,418,587 B2 | 9/2019 | Kim et al. |
| 2011/0084896 A1 | 4/2011 | Ito et al. |
| 2011/0175118 A1 | 7/2011 | Hori et al. |
| 2011/0233570 A1 | 9/2011 | Lee et al. |
| 2013/0001610 A1 | 1/2013 | Iwakura et al. |
| 2013/0016499 A1 | 1/2013 | Yee et al. |
| 2013/0048940 A1* | 2/2013 | Sills ............... H01L 31/022441 257/13 |
| 2013/0228786 A1* | 9/2013 | Park .................. H01L 51/5268 257/72 |
| 2014/0034919 A1 | 2/2014 | Park et al. |
| 2014/0339509 A1 | 11/2014 | Choi et al. |
| 2015/0206927 A1 | 7/2015 | Kuroda et al. |
| 2015/0236306 A1 | 8/2015 | Rohatgi |
| 2015/0380466 A1 | 12/2015 | Koo et al. |
| 2016/0095172 A1* | 3/2016 | Lee ..................... C23C 16/401 313/504 |
| 2017/0194400 A1 | 7/2017 | Shim et al. |
| 2017/0207410 A1* | 7/2017 | Cho .................... H01L 51/0023 |
| 2018/0012940 A1 | 1/2018 | Park et al. |
| 2019/0094541 A1 | 3/2019 | Choi et al. |

FOREIGN PATENT DOCUMENTS

| | | | |
|---|---|---|---|
| JP | 2010-244698 A | | 10/2010 |
| JP | 2011-113704 A | | 6/2011 |
| JP | 2011-204384 A | | 10/2011 |
| JP | 2013-026021 A | | 2/2013 |
| KR | 10-2009-0039179 A | | 4/2009 |
| KR | 20100056937 A | * | 5/2010 |
| KR | 10-2011-0106733 A | | 9/2011 |
| KR | 10-2014-0018548 A | | 2/2014 |
| WO | WO 2013/190661 A1 | | 12/2013 |

OTHER PUBLICATIONS

Japan Patent Office, Notice of Reasons for Refusal, JP Patent Application No. 2019-162513, dated Nov. 5, 2020, ten pages.
China National Intellectual Property Office, Office Action, CN Patent Application No. 201910747407.3, dated Oct. 11, 2021, 20 pages.

* cited by examiner

ORGANIC LIGHT EMITTING DISPLAY DEVICE AND METHOD FOR MANUFACTURING THE SAME

CROSS-REFERENCE TO RELATED APPLICATIONS

This application is a divisional application of U.S. patent application Ser. No. 16/526,856, filed on Jul. 30, 2019, which claims the priority of Republic of Korea Patent Application No. 10-2018-0106744 filed on Sep. 6, 2018, in the Korean Intellectual Property Office, the disclosure of all of which is hereby incorporated by reference in its entirety.

BACKGROUND

1. Technical Field

The present disclosure relates to an organic light-emitting display device capable of improving luminance and light extraction efficiency thereof while preventing image blur, and to a method for manufacturing the same.

2. Description of the Related Art

Recently, a variety of flat display devices (FDDs) have been developed to have reduced weight and volume, which is not the case with a cathode ray tube (CRT). Flat display devices include a liquid crystal display device (LCD), a plasma display panel (PDP), and an organic light emitting display device (OLED). Recently, an electrophoretic display device (EPD) is widely used.

Among them, the organic light-emitting display device is a self-light-emitting display device using a self-light-emitting organic light-emitting element. The OLED has advantages of high response speed, excellent luminance and wide viewing angle. Further, in the OLED, an active element may be mounted on a flexible substrate such as a plastic, thereby realizing a flexible display device. However, despite the advantages as mentioned above, the organic light-emitting display device has a limitation that the light-emitting efficiency is only about 20%.

SUMMARY

One purpose of the present disclosure is to provide an organic light-emitting display device capable of improving luminance and light-emitting efficiency.

Further, another purpose of the present disclosure is to provide a method for manufacturing an organic light-emitting display, by which a manufacturing process of the device may be simplified and image blur due to misalignment of micro-lenses may be minimized.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

According to an aspect of the present disclosure, there is provided an organic light-emitting display device including a plurality of organic light-emitting elements disposed on a substrate and an encapsulating layer covering the plurality of organic light-emitting elements.

In this connection, a first buffer layer which is hydrophilic is located on the encapsulating layer. On the first buffer layer, a second buffer layer is disposed which is hydrophobic. The second buffer layer has a plurality of openings defined therein at positions corresponding to the plurality of organic light-emitting elements, respectively.

In this connection, each of micro-lenses is individually disposed in each of the plurality of openings formed in the second buffer layer, so that a light beam as emitted from each organic light-emitting element at an angle exceeding an emission critical angle is refracted from each micro-lens to have an emission angle smaller than or equal to the emission critical angle and thus is emitted to the outside of the device.

According to another aspect of the present disclosure, there is provided a method for manufacturing an organic light-emitting display device, the method including forming a plurality of organic light-emitting elements on a substrate, and forming an encapsulating layer covering the plurality of organic light-emitting elements.

In this connection, after forming the encapsulating layer, a first buffer layer which is hydrophilic is formed on the encapsulating layer. Then, a second buffer layer which is hydrophobic is formed on the first buffer layer. In this connection, the second buffer layer may be patterned such that a plurality of openings are defined therein at positions corresponding to the plurality of organic light-emitting elements.

When a hydrophilic polymer is applied on the second buffer layer after patterning the second buffer layer, selective wetting may allow the hydrophilic polymer to be self-aligned with and be self-assembled on portions of the first buffer layer exposed through the openings in the second buffer layer respectively and thus to form micro-lenses.

The display device according to the present disclosure having the features as described below has following effects. However, the present disclosure is not limited thereto.

According to the present disclosure, the micro-lens is formed on the encapsulating layer formed to protect the organic light-emitting element. Thus, the micro-lens may emit light emitted from the organic light-emitting element at an angle exceeding an emission critical angle to the outside of the device via refraction of the light, thereby to improve luminance and light-emitting efficiency of the device.

Further, according to the present disclosure, self-aligning and self-assembling the micro-lenses with and at precise locations (corresponding to the organic light-emitting elements) via hydrophilic buffer patterning and hydrophobic buffer patterning on the encapsulating layer may result in minimizing the image blur due to the misalignment of the micro-lenses while resulting in the simplification of the manufacturing process of the process.

Embodiments also relate to an organic light-emitting display device including a substrate, a plurality of organic light-emitting elements disposed on the substrate, an encapsulating layer covering the plurality of organic light-emitting elements, a first buffer layer disposed on the encapsulating layer. The first buffer layer may be hydrophilic. The organic light-emitting display device also includes a second buffer layer disposed on the first buffer layer. The second buffer layer may be hydrophobic and have a plurality of openings. Each opening in the plurality of openings overlaps with a respective organic light-emitting element in the plurality of organic light-emitting elements and exposes a corresponding portion of the first buffer layer. The organic light-emitting display device also includes a plurality of micro-lenses, wherein each micro-lens is disposed on the exposed portion of the hydrophilic first buffer layer of a corresponding opening in the plurality of openings.

Embodiments also relate to a method for manufacturing an organic light-emitting display device. A plurality of organic light-emitting elements are formed on a substrate. An encapsulating layer is formed covering the plurality of organic light-emitting elements. A first buffer layer is formed on the encapsulating layer. The first buffer layer may be hydrophilic. A second buffer layer is formed on the first buffer layer. The second buffer layer may be hydrophobic and has a plurality of openings. Each opening in the plurality of openings overlaps with a respective organic light-emitting element in the plurality of organic light-emitting elements and exposes a corresponding portion of the first buffer layer. A hydrophilic polymer is applied onto the second buffer layer such that a plurality of micro-lenses are respectively formed on the exposed portions of the hydrophilic first buffer layer.

Embodiments also relate to an organic light-emitting display device including a substrate, a plurality of organic light-emitting elements disposed on the substrate, an encapsulating layer covering the plurality of organic light-emitting elements, a first buffer layer disposed on the encapsulating layer, and a second buffer layer disposed on the first buffer layer. The second buffer layer may have an opening with a first part of the second buffer layer and a second part of the second buffer layer separated from the first part of the second buffer layer. The opening may overlap with a respective organic light-emitting element in the plurality of organic light-emitting elements and exposes a portion of the first buffer layer through the first part of the second buffer layer and the second part of the second buffer layer. The organic light-emitting display device also includes a micro-lens disposed within the opening between the first part of the second buffer layer and the second part of the second buffer layer.

Further specific effects of the present disclosure as well as the effects as described above will be described in conduction with illustrations of specific details for carrying out the present disclosure.

DETAILED DESCRIPTION

Figure 1:
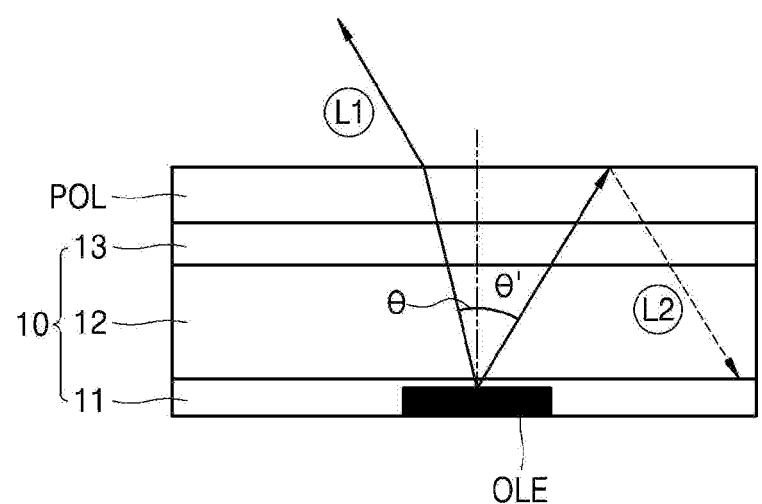
FIG. 1 is a schematic cross-sectional view of a structure of an organic light-emitting display device, according to an embodiment of the present disclosure.

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light-emitting display device according to various embodiments of the present disclosure will be described in detail with reference to the drawings attached hereto.

FIG. 1 is a schematic cross-sectional view of a structure of an organic light-emitting display device, according to an embodiment of the present disclosure.

Referring to FIG. 1, the organic light-emitting display device includes an organic light-emitting element OLE disposed on a substrate, an encapsulating layer 10 encapsulating an upper portion of the organic light-emitting element OLE, and a polarizing plate POL disposed on the encapsulating layer 10.

In this connection, the encapsulating layer 10 covers the organic light-emitting element OLE to protect the organic light-emitting element OLE from oxygen and moisture. The encapsulating layer 10 may include at least one of an organic film or an inorganic film. For example, the encapsulating layer 10 may include a first inorganic film 11 covering the upper portion of the organic light-emitting element OLE, an organic film 12 formed on the first inorganic film 11, and a second inorganic film 13 formed on the organic film 12.

Further, on the second inorganic film 13, a polarizing plate POL may be disposed to prevent reflection of ambient light from the outside.

In this connection, a light beam L1 emitted from the organic light-emitting element OLE at an angle θ smaller than or equal to an emission critical angle may be emitted to the outside of the organic light-emitting display device. However, a light beam L2 emitted from the organic light-emitting element OLE at an angle θ' exceeding the emission critical angle may be totally reflected in the organic light-emitting display device and then may be extinguished therein.

The light beam L2 that is not emitted to the outside of the organic light-emitting display device but disappears due to the total internal reflection may degrade the light-emitting efficiency of the organic light-emitting display device.

Figure 2:
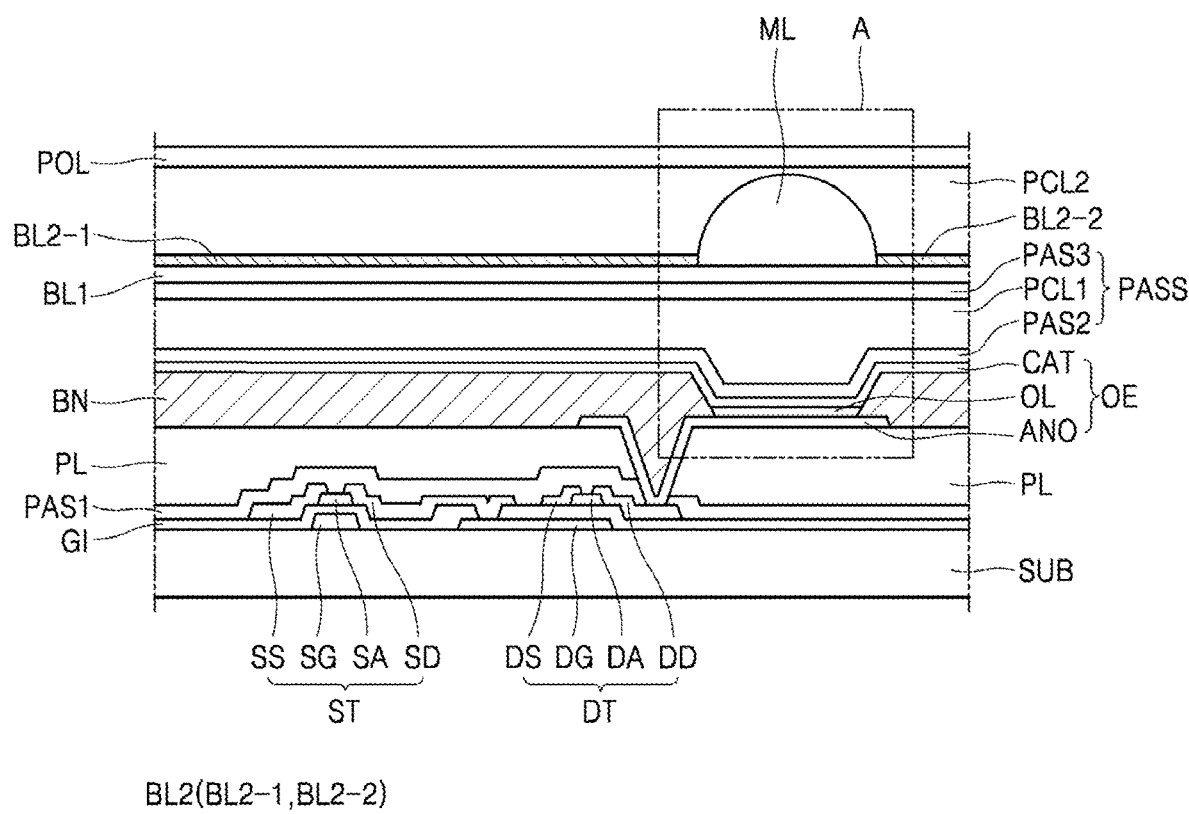
FIG. 2 is a cross-sectional view schematically illustrating a structure of an organic light-emitting display device, according to one embodiment of the present disclosure.

FIG. 2 is a schematic cross-sectional view of an organic light-emitting display device according to one embodiment of the present disclosure.

Referring to FIG. 2, an organic light-emitting display device according to an embodiment of the present disclosure includes a plurality of organic light-emitting element OLEs disposed on a substrate SUB, an encapsulating layer PASS covering a plurality of organic light-emitting elements OLEs, and a polarizing plate POL disposed on the encapsulating layer PASS.

For reference, FIG. 2 shows a single organic light-emitting element OLE on the substrate SUB. However, FIG. 2 shows a portion of the organic light-emitting display device. Thus, it should be understood that a plurality of organic light-emitting element OLEs are disposed on the substrate SUB, although not separately shown.

In one example, the substrate SUB may be made of glass or plastic material having flexible properties. For example, the substrate SUB may be made of a material such as PI (Polyimide), PET (polyethylene terephthalate), PEN (polyethylene naphthalate), PC (polycarbonate), PES (polyethersulfone), PAR (polyarylate), PSF (polysulfone), or COC (ciclic-olefin copolymer).

Although not shown separately, a region of the substrate SUB is divided into a display region for displaying video and a non-display region for receiving various elements for driving the display region. A plurality of pixel regions are defined in the display region. Each pixel contains organic light-emitting elements OLEs and thin film transistors STs and DTs for driving the organic light-emitting elements OLEs.

Each thin film transistor includes a switching thin film transistor ST and a driving thin film transistor DT. The switching thin film transistor ST includes a switching gate electrode SG, a gate insulating film GI, a switching channel layer SA, a switching source electrode SS, and a switching drain electrode SD. The driving thin film transistor DT includes a driving gate electrode DG connected to the switching drain electrode SD of the switching thin film transistor ST, a gate insulating film GI, a driving channel layer DA, a driving source electrode DS and a driving drain electrode DD. The driving thin film transistor DT acts to drive the driving organic light-emitting element OLE of the pixel PA selected by the switching thin film transistor ST.

The structure of each of the thin film transistors ST and DT as shown in FIG. 2 is merely an example, and thus is not necessarily limited thereto. A top gate structure, a bottom gate structure, or a double gate structure may be used instead of the structure shown in FIG. 2 as long as the top gate structure, a bottom gate structure, or a double gate structure can drive the organic light-emitting element OLE.

An insulating layer PAS1 may be located on the thin film transistors ST and DT in order to protect the source/drain electrodes and channel layers of the thin film transistors ST and DT. A planarization layer PL may be located on the insulating layer PAS1. In this connection, the insulating layer PAS1 may be made of a material such as silicon oxide, silicon nitride, silicon oxynitride, aluminum nitride, aluminum oxide, zirconium nitride, zirconium oxide, titanium nitride, titanium oxide, hafnium nitride, tantalum nitride, or magnesium oxide.

The planarization layer PL defines a flat top face. Thus, the planarization layer PL prevents a short circuit of a first electrode ANO and/or a second electrode CAT of the organic light-emitting element OLE formed on the planarization layer PL. For example, the planarization layer PL may be made of a resin such as an acrylic resin, a phenol resin, a polyimide resin, a polyamide resin, an unsaturated polyester resin, a polyphenylene resin, a polyphenylene sulfide resin, or a photoresist material such as benzocyclobutene.

The first electrode ANO is located in a partial region of the planarization layer PL and on the planarization layer PL. The first electrode ANO is located within one pixel so that the first electrode does not come into contact with a first electrode or an anode of a neighboring pixel. The first electrode ANO is electrically connected to the driving drain electrode DD of the driving thin film transistor DT via a contact hole passing through the insulating layer PAS1 and planarization layer PL.

The first electrode ANO may be embodied as a transparent electrode or a reflective electrode. The transparent electrode may be made of a transparent conductive oxide such as ITO (Indium Tin Oxide), IZO (Indium Zinc Oxide), AZO (Aluminum Zinc Oxide), GZO (Gallium Doped Zinc Oxide), ZTO (Zinc Tin Oxide), GTO (Gallium Tin Oxide) or FTO (Fluorine Doped Tin Oxide). The reflective electrode may be made of a reflective metal or an alloy thereof such as Mo, MoW, Cr, Ag, APC (Ag—Pd—Cu alloy), Al or Al alloy. Alternatively, the first electrode ANO may have a structure in which a reflective film made of a reflective metal or an alloy thereof is stacked on the transparent conductive oxide.

On the first electrode ANO, a black bank layer BN is disposed. The black bank layer BN has a plurality of bank openings defined therein, each defining an opening region of each of a plurality of organic light-emitting elements OLEs. An opening in the black bank layer BN may expose at least a part of a respective organic light-emitting element OLE. Each opening defines each pixel region.

Specifically, the black bank layer BN has a bank opening defined therein for exposing at least a part of the first electrode ANO. However, it is appreciated that in other embodiments, the openings in the black bank layer BN may be configured to expose other parts of the organic light-emitting elements OLE's, such as the organic light-emitting layer OL, or the second electrode CAT as well. The opening defined in the black bank layer BN may have a generally tapered shape. That is, as the opening in the black bank layer BN has the tapered shape, a horizontal dimension of the opening may increase as it goes from the first electrode ANO toward the second electrode CAT.

Further, the black bank layer BN is made of an insulating material including a light shielding material. This prevents light from propagating in a region other than the opening in the black bank layer BN, and, at the same time, may suppress electrical conduction between adjacent organic light-emitting elements OLEs in adjacent pixel regions respectively.

An organic light-emitting layer OL is located on a portion of the first electrode ANO as exposed by the opening of the black bank layer BN.

The organic light-emitting layer OL includes a hole injection layer HIL, a hole transport layer HTL, an emission layer, EML, an electron transport layer ETL, and an electron injection layer EIL upwardly from a top of the first electrode ANO in this order.

The second electrode CAT is placed on the black bank layer BN and the organic light-emitting layer OL. The second electrode CAT may be made of a transparent electrode or a reflective electrode. The transparent electrode may be made of a transparent conductive oxide such as ITO (Indium Tin Oxide), IZO (Indium Zinc Oxide), AZO (Aluminum Zinc Oxide), GZO (Gallium Doped Zinc Oxide), ZTO (Zinc Tin Oxide), GTO (Gallium Tin Oxide) or FTO (Fluorine Doped Tin Oxide). The reflective electrode may be made of a reflective metal or an alloy thereof such as Mo, MoW, Cr, Ag, APC (Ag—Pd—Cu alloy), Al or Al alloy. However, as shown in FIG. 2, for a top emission-based organic light-emitting display device, the second electrode CAT is preferably embodied as a transparent electrode.

In the organic light-emitting element, exciton may occur in an excitation process when holes and electrons injected from the anode and cathode are recombined in the light-emitting layer EML and, thus, light-emitting may occur due to energy from the exciton. The organic light-emitting display device displays video by electrically controlling an amount of light generated in the light-emitting layer EML of the organic light-emitting element OLE.

On the second electrode CAT, the encapsulating layer PASS is disposed to protect the driving elements such as the thin film transistors ST and DT, and the organic light-emitting element OLE from oxygen and moisture.

The encapsulating layer PASS may include at least one of an inorganic material layer or an organic material layer. The encapsulating layer PASS may include a structure in which the inorganic material layer and the organic material layer may be alternately laminated on top of another. In one example, the encapsulating layer PASS may have a stack structure between a first inorganic material layer PAS2 covering the top of the second electrode CAT, an organic material layer PCL1 formed on the first inorganic material layer PAS2, and a second inorganic material layer PAS3 formed on the organic material layer PCL1.

In this connection, each of the first inorganic material layer PAS2 and the second inorganic material layer PAS3 may be made of a material such as silicon oxide, silicon nitride, silicon oxynitride, aluminum nitride, aluminum oxide, zirconium nitride, zirconium oxide, titanium nitride, titanium oxide, hafnium nitride, tantalum nitride or magnesium oxide.

The organic material layer PCL1 defines a flat top surface. This may lead to uniform optical refraction from a plurality of micro-lenses ML formed on the organic material layer PCL1. For example, the organic material layer PCL1 may be made of a resin such as an acrylic resin, a phenol resin, a polyimide resin, a polyamide resin, an unsaturated polyester resin, a polyphenylene resin, a polyphenylene sulfide resin, or various photoresist materials such as benzocyclobutene and the like.

Then, according to the present disclosure, a first buffer layer BL1 and a second buffer layer BL2 are sequentially disposed on the encapsulating layer PASS, specifically, the second inorganic material layer PAS3 of the encapsulating layer PASS.

The first buffer layer BL1 is formed entirely on the second inorganic material layer PAS3 of the encapsulating layer PASS, and has a hydrophilic surface.

In order for the first buffer layer BL1 to have the hydrophilic surface, the first buffer layer BL1 may be made of a hydrophilic polymer or may have at least a surface as treated in a hydrophilic manner. In one example, the first buffer layer BL1 may be achieved by forming a layer of hydrophobic polymer and then binding a hydrophilic function group to a surface of the hydrophobic polymer via surface modification. In another example, the first buffer layer BL1 may be achieved by forming a layer of hydrophobic polymer and then coating a hydrophilic polymer onto the hydrophobic polymer layer.

In this connection, the hydrophilic polymer for achieving the first buffer layer BL1 may be selected from a group consisting of polyethylene oxide, polylactic acid, poly-4-vinylpyridine, polyvinyl ester, polyvinyl ether, polyvinyl ketone, polyvinylpyridine, polyvinylpyrrolidone, polybutadiene, polypropylene and polyethylene-propylene-diene polymers. The present disclosure is not necessarily limited thereto. The hydrophobic polymer for achieving the first buffer layer BL1 may be selected from a group consisting of polyvinyl chloride, polyethylene, polypropylene, polymethylmethacrylate, polyethylmethacrylate, polypentadiene, polyamide-6, polycarbonate, polyethylene terephthalate, and polystyrene polymers. However, the present disclosure is not necessarily limited thereto. That is, in addition to the above-mentioned polymers, a polymer which may be hydrophilic or hydrophobic may be used to achieve the first buffer layer BL1.

The second buffer layer BL2 is formed entirely on the first buffer layer BL1 and is made of a hydrophobic polymer. The hydrophobic polymer for achieving the second buffer layer BL2 may be selected from a group consisting of polyvinyl chloride, polyethylene, polypropylene, polymethylmethacrylate, polyethylmethacrylate, polypentadiene, polyamide-6, polycarbonate, polyethylene terephthalate, and polystyrene polymers. However, the present disclosure is not necessarily limited thereto. That is, in addition to the above-mentioned polymers, a polymer which may be hydrophobic may be used to achieve the second buffer layer BL2.

Furthermore, the second buffer layer BL2 is made of the hydrophobic polymer containing a light-shielding material therein, thereby preventing light beams from emitting or propagating in a region other than the opening defined in the second buffer layer BL2.

The second buffer layer BL2 has a plurality of openings defined at positions corresponding to the plurality of organic light-emitting elements OLEs. The opening in the second buffer layer BL2 is preferably defined at a position corresponding to the opening in the black bank layer BN. Accordingly, the light beams emitted from the organic light-emitting element OLE may be emitted to the outside of the device through the opening in the black bank layer BN and the opening in the second buffer layer BL2. Each opening in the plurality of openings may overlap with a respective organic light-emitting element OLE in the plurality of organic light-emitting elements, and may expose a corresponding portion of the first buffer layer BL1. Specifically, an opening in the second buffer layer BL2 may be formed with a first part BL2-1 and a second part BL2-2 separated from the first part. A portion of the first buffer layer BL1 may be exposed through the first part and the second part of the second buffer layer BL2.

The hydrophilic surface of the first buffer layer BL1 is exposed through the opening defined in the second buffer layer BL2. Each micro-lens ML is arranged in each opening in the second buffer layer BL2 on the exposed portion of the hydrophilic surface of the first buffer layer BL1 of a corresponding opening in the first buffer layer BL1.

In this connection, the micro-lens ML may be made of a hydrophilic polymer. More specifically, the micro-lens ML may be formed via self-aligning and self-assembly of the hydrophilic polymer of the lens onto the hydrophilic surface of the first buffer layer BL1 exposed through the opening defined in the second buffer layer BL2. The micro-lens ML may be disposed within the opening between the first part BL2-1 and the second part BL2-2 of the second buffer layer BL2. The micro-lens ML may substantially occupy the opening, and contact a side surface of the first part BL2-1 and a side surface of the second part BL2-2.

Example materials for forming the hydrophilic polymer for the micro-lens ML may be selected from a group consisting of poly(N-isopropylacrylamide)(PNIPAM), polyacrylamide(PAM), poly(2-oxazoline), polyglutamicacid (PGA), polyethylenimine(PEI), polyacrylicacid, polymethacrylate and other acrylic polymers, polyethyleneglycol (PEG) and polyethyleneoxide, polyvinylalcohol(PVA) and copolymers, polyvinylpyrrolidone(PVP) and copolymers, polyelectrolytes, cucurbit[n]uril hydrate and miscellaneous hydrophilic polymers. However, the present disclosure is not necessarily limited thereto.

Accordingly, the plurality of micro-lenses ML may be precisely aligned to specific positions (corresponding to the organic light-emitting elements OLEs respectively) on the encapsulating layer PASS via the hydrophobic pattern of the second buffer layer BL2 on the first buffer layer BL1. Therefore, this may prevent the image blur due to misalignment of the micro-lenses ML. The micro-lens ML may have a spherical or elliptical shape with curvature, but the shape of the micro-lens ML is not limited hereto.

A planarization layer PCL2 may be formed on the second buffer layer BL2 in which a plurality of micro-lenses ML are partially arranged. The polarizing plate POL may be disposed on the planarization layer PCL2 to prevent reflection of ambient light from the outside.

The planarization layer PCL2 defines a flat top face. For example, the planarization layer PCL2 may be made of a resin such as an acrylic resin, a phenol resin, a polyimide resin, a polyamide resin, an unsaturated polyester resin, a polyphenylene resin, a polyphenylene sulfide resin, or a photoresist material such as benzocyclobutene.

In one example, a refractive index of the planarization layer PCL2 is preferably lower than that of the micro-lenses ML. In particular, as a difference between the refractive index of the micro-lenses ML and the refractive index of the planarization layer PCL2 increases, the light emitted through the micro-lenses ML may be further focused on a point above the micro-lenses ML, thereby to further enhance the luminance and light extraction effect of the device. In this connection, the difference in refractive index between the planarization layer PCL2 and the micro-lenses ML may be at least 0.09 or greater, preferably 0.14 or greater, and more preferably 0.19 or greater.

In a conventional organic light-emitting display device, light beams emitted from the organic light-emitting element at an angle exceeding the emission critical angle are totally reflected and thus disappear in the organic light-emitting display device. This reduces the light-emitting efficiency of the organic light-emitting display device.

Figure 3:
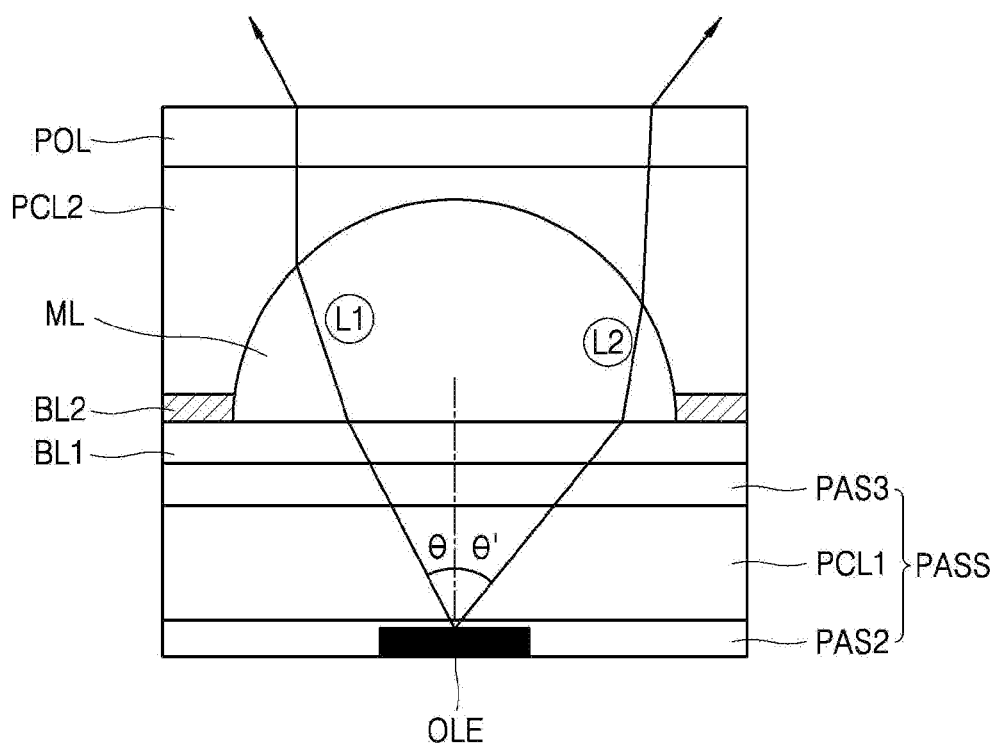
FIG. 3 is a cross-sectional view of a region A shown in FIG. 2, according to an embodiment of the present disclosure.

However, referring to FIG. 3, as a cross-sectional view of an A region shown in FIG. 2, in the organic light-emitting display device according to an embodiment of the present disclosure, a light beam L2 emitted from the organic light-emitting element OLE at an angle θ' exceeding the emission critical angle is refracted from the micro-lenses ML to have an emission angle smaller than or equal to the emission critical angle. Thus, the light beam L2 may be emitted outside the organic light-emitting display device. Accordingly, this may improve the luminance and light-emitting efficiency of the organic light-emitting display device by reducing the total amount of light that is totally reflected and thus eliminated in the organic light-emitting display device.

FIG. 4 to FIG. 9 are cross-sectional views schematically showing structures corresponding to steps of a process of manufacturing an organic light-emitting display device according to an embodiment of the present disclosure.

Figure 4:
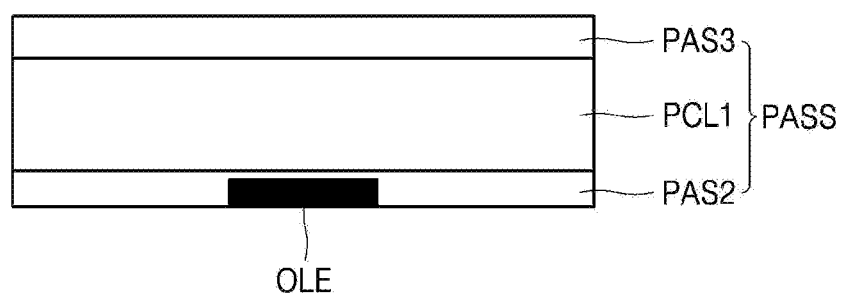
FIG. 4 to FIG. 9 are cross-sectional views schematically showing respectively structures corresponding to steps of a process of manufacturing an organic light-emitting display device, according to an embodiment of the present disclosure.

First, a plurality of organic light-emitting element OLEs are formed on the substrate, and then, the encapsulating layer PASS is formed to protect the driving elements such as the thin film transistors ST and DT and organic light-emitting element OLE from oxygen and moisture (See FIG. 4).

In this connection, a process of manufacturing the organic light-emitting element OLE may include forming the first electrode ANO on the substrate SUB, forming the black bank layer BN having the openings defined therein on the first electrode ANO, forming the light-emitting layer OL on a portion of the first electrode exposed through the opening in the black bank layer BN, and forming the second electrode CAT on the light-emitting layer OL (See FIG. 2).

The encapsulating layer PASS may include at least one of an inorganic material layer or an organic material layer. The encapsulating layer PASS may include a structure in which the inorganic material layer and the organic material layer may be alternately laminated on top of another. In one example, the encapsulating layer PASS may have a stack structure between a first inorganic material layer PAS2 covering the top of the second electrode CAT, an organic material layer PCL1 formed on the first inorganic material layer PAS2, and a second inorganic material layer PAS3 formed on the organic material layer PCL1.

In this connection, each of the first inorganic material layer PAS2 and the second inorganic material layer PAS3 may be made of a material such as silicon oxide, silicon nitride, silicon oxynitride, aluminum nitride, aluminum oxide, zirconium nitride, zirconium oxide, titanium nitride, titanium oxide, hafnium nitride, tantalum nitride or magnesium oxide.

Further, each of the first inorganic material layer PAS2 and the second inorganic material layer PAS3 may be formed by vacuum-based film-formation methods including sputtering, chemical vapor deposition CVD, E-beam, thermal evaporation, and thermal ion beam assisted deposition (IBAD).

For example, the organic material layer PCL1 may be made of a resin such as an acrylic resin, a phenol resin, a polyimide resin, a polyamide resin, an unsaturated polyester resin, a polyphenylene resin, a polyphenylene sulfide resin, or various photoresist materials such as benzocyclobutene and the like.

Further, the organic material layer PCL1 may be formed via one of atomic layer deposition, chemical vapor deposition, dip coating, spin-coating and ink-jet methods.

Figure 5:
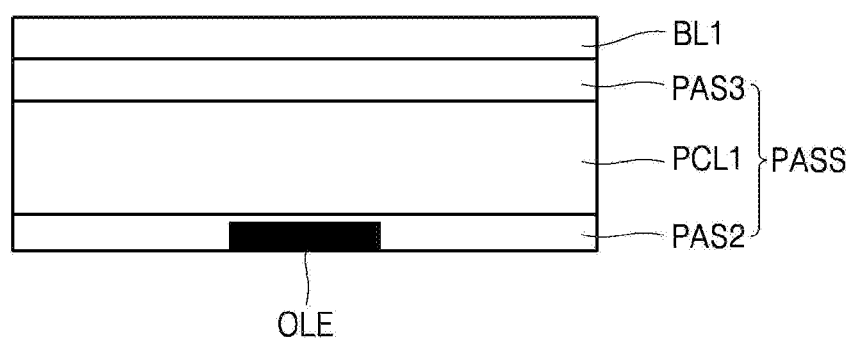
Figure 6:
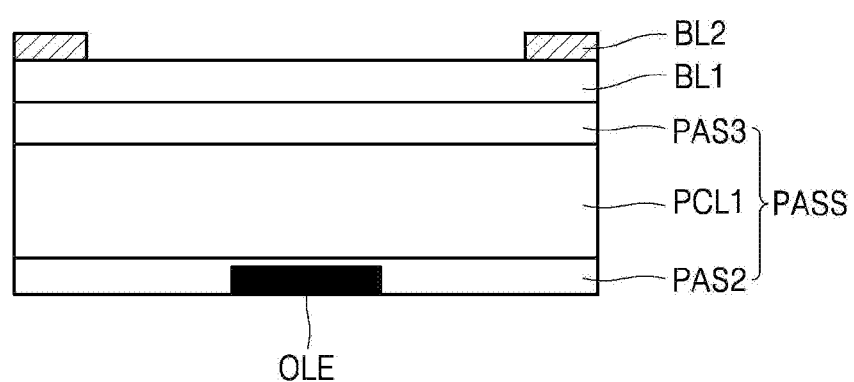
Figure 7:
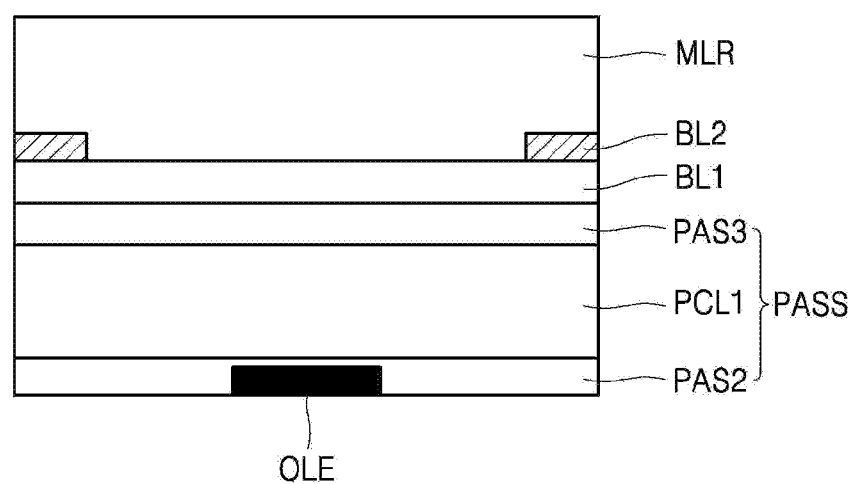
Figure 8:
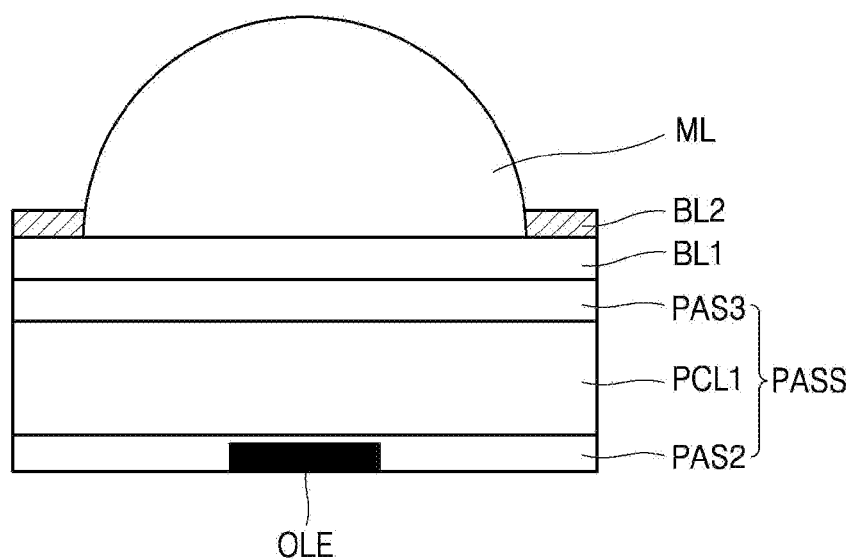
Figure 9:
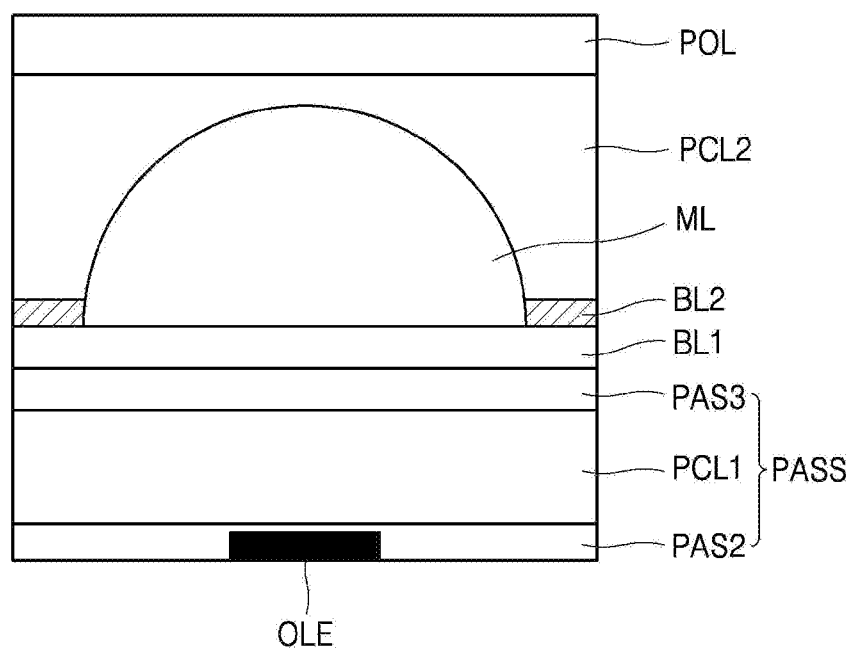

Next, the hydrophilic first buffer layer BL1 is formed on the encapsulating layer PASS (Refer to FIG. 5).

In this connection, the hydrophilic first buffer layer BL1 refers to a layer at least having an hydrophilic surface. In order for the first buffer layer BL1 to have the hydrophilic surface, the first buffer layer BL1 may be made of a hydrophilic polymer or may have at least a surface as treated in a hydrophilic manner.

In one example, the first buffer layer BL1 may be achieved by forming a layer of hydrophobic polymer and then binding a hydrophilic function group to a surface of the hydrophobic polymer via surface modification. In another example, the first buffer layer BL1 may be achieved by forming a layer of hydrophobic polymer and then coating a hydrophilic polymer onto the hydrophobic polymer layer.

In this connection, the hydrophilic polymer for achieving the first buffer layer BL1 may be selected from a group consisting of polyethylene oxide, polylactic acid, poly-4-vinylpyridine, polyvinyl ester, polyvinyl ether, polyvinyl ketone, polyvinylpyridine, polyvinylpyrrolidone, polybutadiene, polypropylene and polyethylene-propylene-diene polymers. The present disclosure is not necessarily limited thereto. The hydrophobic polymer for achieving the first buffer layer BL1 may be selected from a group consisting of polyvinyl chloride, polyethylene, polypropylene, polymethylmethacrylate, polyethylmethacrylate, polypentadiene, polyamide-6, polycarbonate, polyethylene terephthalate, and polystyrene polymers. However, the present disclosure is not necessarily limited thereto. That is, in addition to the above-mentioned polymers, a polymer which may be hydrophilic or hydrophobic may be used to achieve the first buffer layer BL1.

Further, the first buffer layer BL1 may be formed via one of atomic layer deposition, chemical vapor deposition, dip coating, spin-coating and ink-jet methods.

Next, the second buffer layer BL2 is formed and patterned on the first buffer layer BL1.

The hydrophobic polymer for achieving the second buffer layer BL2 may be selected from a group consisting of polyvinyl chloride, polyethylene, polypropylene, polymethylmethacrylate, polyethylmethacrylate, polypentadiene, polyamide-6, polycarbonate, polyethylene terephthalate, and polystyrene polymers. However, the present disclosure is not necessarily limited thereto. That is, in addition to the above-mentioned polymers, a polymer which may be hydrophobic may be used to achieve the second buffer layer BL2. The second buffer layer BL2 may be formed by photolithography, plasma etching, or printing using the above-described hydrophobic polymer.

Then, the second buffer layer BL2 is patterned to have a plurality of openings defined at positions corresponding to the plurality of organic light-emitting elements OLEs respectively. In this connection, each opening in the second buffer layer BL2 is preferably defined at a position corresponding to each opening in the black bank layer BN. The second buffer layer BL2 may have a plurality of openings, and each opening may overlap with a respective organic light-emitting element OLE in the plurality of organic light-emitting elements, and may expose a corresponding portion of the first buffer layer BL1.

Next, a hydrophilic polymer is applied on the second buffer layer BL2. Thus, the self-aligning and self-assembly of the applied hydrophilic polymer on the hydrophilic surface of the first buffer layer BL1 exposed through the opening in the second buffer layer BL2 is induced. Thus, the hydrophilic polymer is applied such that the plurality of micro-lenses ML are formed on the exposed portions of the hydrophilic first buffer layer BL1. As a result, the micro-lenses ML are formed (See FIG. 7 and FIG. 8).

When the hydrophilic polymer is applied on the second buffer layer BL2, selective wetting phenomenon may allow the hydrophilic polymer to bypass the hydrophobic surface of the second buffer layer BL2 but to be concentrated on the hydrophilic surface of the first buffer layer BL1 exposed through the opening in the second buffer layer BL2. Therefore, the hydrophilic polymer may not be present on the hydrophobic surface of the second buffer layer BL2 due to the hydrophilic-hydrophobic repulsion force but may be present only on the hydrophilic surface of the first buffer layer BL1 exposed through the opening in the second buffer layer BL2. Furthermore, the applied hydrophilic polymer may self-align with and self-assemble on the positions corresponding to the organic light emission elements OLEs respectively on the hydrophilic surface of the first buffer layer BL1, thereby to form hemispherical or semi-elliptical micro-lenses ML.

Finally, the planarization layer PCL2 is formed on the second buffer layer BL2 into the micro-lenses ML are partially arranged. Then, on the planarization layer PCL2, the polarizing plate POL is formed to prevent reflection of ambient light from the outside (See FIG. 9).

The planarization layer PCL2 defines a flat top face. For example, the planarization layer PCL2 may be made of a resin such as an acrylic resin, a phenol resin, a polyimide resin, a polyamide resin, an unsaturated polyester resin, a polyphenylene resin, a polyphenylene sulfide resin, or a photoresist material such as benzocyclobutene.

In one example, a refractive index of the planarization layer PCL2 is preferably lower than that of the micro-lenses ML. In particular, as a difference between the refractive index of the micro-lenses ML and the refractive index of the planarization layer PCL2 increases, the light emitted through the micro-lenses ML may be further focused on a point above the micro-lenses ML, thereby to further enhance the luminance and light extraction effect of the device.

Figure 10:
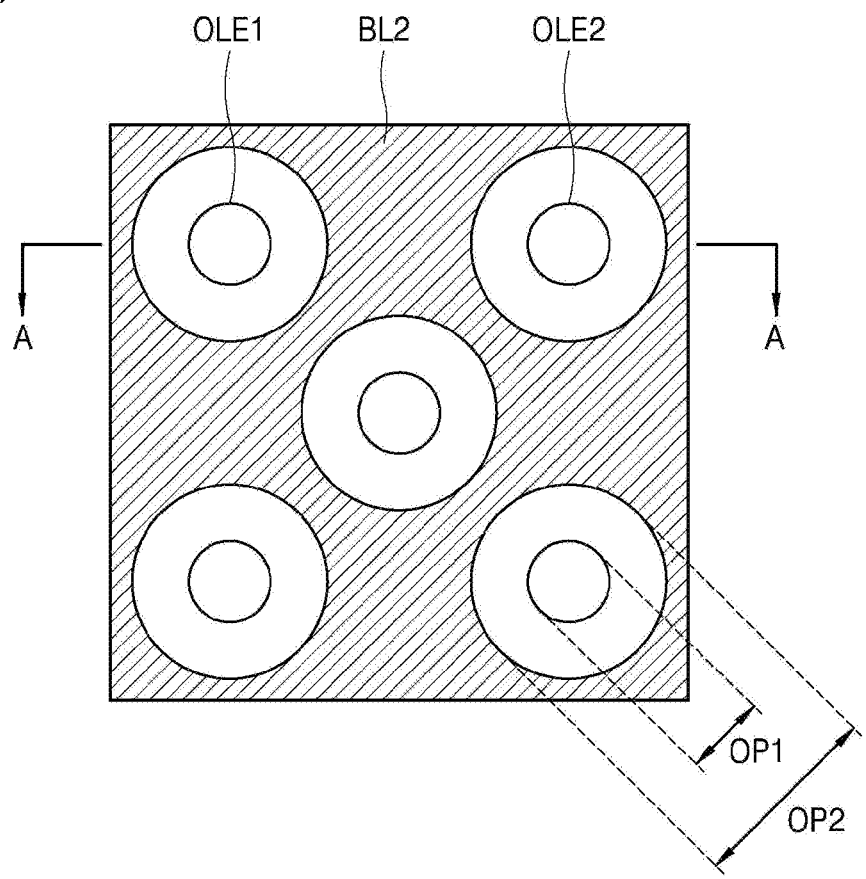
FIG. 10 is a top view of a second buffer layer used in the organic light-emitting display device shown in FIG. 2, according to an embodiment of the present disclosure.

FIG. 10 is a top view of the second buffer layer used in the organic light-emitting display device shown in FIG. 2.

The second buffer layer BL2 includes openings OP2 which expose plurality of organic light-emitting elements OLE1 and OLE2 respectively. Each of portions of the organic light-emitting elements OLE1 and OLE2 exposed through the openings OP2 defined in the second buffer layer BL2 is larger than each of portions the organic light-emitting elements OLE1 and OLE2 exposed through the openings OP1 of the blanket layer BN respectively.

That is, referring to FIG. 10, a horizontal area of the opening OP2 in the second buffer layer BL2 is larger than a horizontal area of the opening OP1 in the black bank layer which defines an opening region of the organic light-emitting elements OLE1, OLE2. In this connection, each opening OP2 defined in the second buffer layer BL2 is substantially occupied by each micro-lens. Thus, the light beam emitted through the opening OP1 in the black bank layer BN may be emitted to the outside of the device through the micro-lens.

According to the present disclosure, the horizontal area of the opening OP2 in the second buffer layer BL2 is larger than the horizontal area of the opening OP1 in the black bank layer due to the taper shaped opening, such that the light diffused upwards through the opening OP1 in the black bank layer BN is emitted to the outside of the device through the opening OP2 in the second buffer layer BL2 at a maximum level.

In this connection, the light emitted from the organic light-emitting element OLE1 or OLE2 may be blocked by the black bank layer and the hydrophobic pattern of the second buffer layer BL2. This may prevent light from propagating between adjacent pixel regions.

Figure 11:
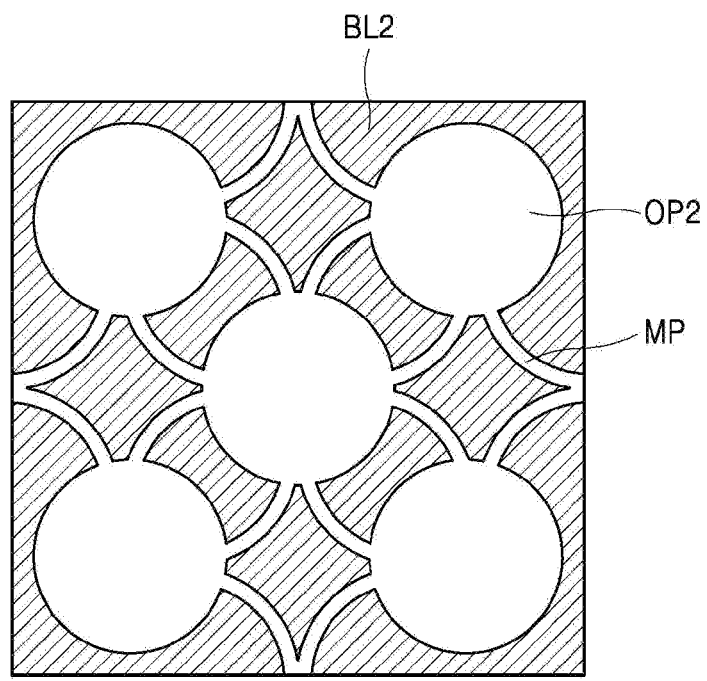
FIG. 11 is a top view of another embodiment of a second buffer layer, according to an embodiment of the present disclosure.

Referring to FIG. 11 showing another embodiment of the second buffer layer BL2, the second buffer layer BL2 may have an opening pattern MP in which adjacent openings OP2 are interconnected with each other. This opening pattern MP exposes the hydrophilic surface of the first buffer layer BL1 as in the openings OP2. Thus, the second buffer layer BL2 may have an opening pattern MP that connects a first opening in the plurality of openings in the second buffer layer BL2 with a second opening in the plurality of openings that is adjacent to the first opening.

The opening pattern MP may be formed by forming polymer channels communicating between the plurality of openings OP2 formed in the second buffer layer BL2, and then applying a hydrophilic polymer for forming micro-lenses on the second buffer layer BL2, such that the hydrophilic polymer may flow along the polymer channels. Thus, the hydrophilic polymer does not remain on the second buffer layer BL2 but flows along the polymer channels and then flows downwardly through the openings OP2 in the second buffer layer BL2 toward the hydrophilic surface of the first buffer layer BL1 exposed through the openings OP2. Thus, the hydrophilic polymer may concentrate on the hydrophilic surface of the first buffer layer BL1 exposed through the openings OP2.

In this connection, when a width of each of opening pattern MP is excessively large, the concentration of the applied hydrophilic polymer on the hydrophilic surface of the first buffer layer BL1 exposed through the openings OP2 may be lowered. Thus, it may be difficult to form the hemispherical or semi-elliptical micro-lenses ML on the hydrophilic surface of the first buffer layer exposed through the openings OP2.

Thus, in one example, when a diameter of the opening OP2 is at least 10 μm, the width of the opening pattern MP is preferably at most 3 μm. Further, as the width of the opening pattern MP is smaller, the concentration effect of the hydrophilic polymer through opening pattern MP may be improved.

Figure 12:
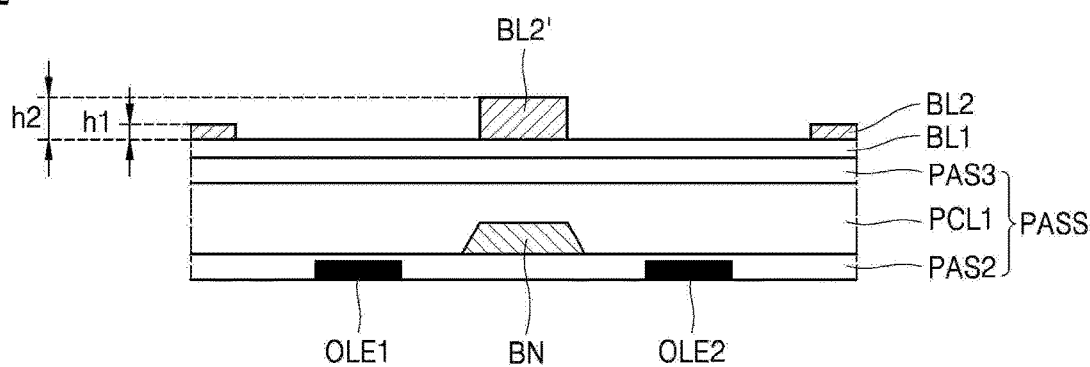
FIG. 12 is a schematic cross-sectional view of a structure of an organic light-emitting display device cut along line a A-A' of FIG. 10, according to an embodiment of the present disclosure.

FIG. 12 is a schematic cross-sectional view of a structure of an organic light-emitting display device cut along a line A-A' of FIG. 10, according to an embodiment of the present disclosure.

Referring to FIG. 12, portions BL2 and BL2' of the second buffer layer may be formed to be different in thickness thereof.

More specifically, a thickness h2 of a portion BL2' of the second buffer layer disposed between two adjacent organic light-emitting elements OLE1 and OLE2 may be larger than a thickness h1 of a portion BL2 of the second buffer layer BL2 disposed at an outer edge of a pixel defined by the two adjacent organic light-emitting elements OLE1 and OLE2. Accordingly, the portions BL2 and BL2' have a thickness difference. In other words, a top face or surface of the second buffer layer may be inclined.

When the top face of the second buffer layer is inclined, the hydrophilic polymer as applied onto the second buffer layer to form the micro lenses may flow smoothly toward the hydrophilic surface of the first buffer layer BL1 exposed through the openings OP2. This may promote the self-aligning and self-assembly of the hydrophilic polymer for the formation of the micro-lenses ML.

Further, a top face of the portion BL2' of the second buffer layer disposed between two adjacent organic light-emitting elements OLE1 and OLE2 may be formed to be inclined downward toward each of the openings OP2 in the second buffer layer exposing the organic light-emitting elements OLE1 and OLE2 respectively. Thus, the flowability of the hydrophilic polymer as applied may be further improved.

The foregoing description of the embodiments shown in the accompanying drawings herein was made. It may be appreciated that various changes or modifications to the embodiments may be made by the skilled person to the art. Accordingly, it is to be understood that such changes and modifications are included within the scope of the present disclosure, without departing from the spirit of the present disclosure.

What is claimed is:

1. A method for manufacturing an organic light-emitting display device, the method comprising:
   forming a plurality of organic light-emitting elements on a substrate;
   forming an encapsulating layer covering the plurality of organic light-emitting elements;
   forming a first buffer layer on the encapsulating layer, wherein the first buffer layer is hydrophilic;
   forming a second buffer layer on the first buffer layer, wherein the second buffer layer is hydrophobic and has a plurality of openings, wherein each opening in the plurality of openings overlaps with a respective organic light-emitting element in the plurality of organic light-emitting elements and exposes a corresponding portion of the first buffer layer; and
   applying a hydrophilic polymer onto the second buffer layer such that a plurality of micro-lenses are respectively formed on the exposed portions of the hydrophilic first buffer layer.

2. The method of claim 1, wherein the second buffer layer is made of a hydrophobic polymer including a light-blocking material.

3. The method of claim 1, wherein forming the plurality of organic light-emitting elements on the substrate includes:
   forming a first electrode on the substrate;

forming a bank layer on the first electrode, wherein the bank layer has a plurality of bank openings, wherein each bank opening exposes at least a part of the first electrode;

forming a light-emitting layer on the exposed part of the first electrode; and forming a second electrode on the light-emitting layer.

4. The method of claim 3, wherein an area of a bank opening in the plurality of bank openings in the bank layer is smaller than an area of an opening in the plurality of openings in the second buffer layer.

5. The method of claim 1, wherein forming the second buffer layer further includes patterning the second buffer layer to form an opening pattern that connects a first opening in the plurality of openings with a second opening adjacent the first opening.

6. The method of claim 1, wherein forming the second buffer layer further includes forming the second buffer layer such that a top surface of the second buffer layer is inclined.

\* \* \* \* \*